United States Patent
Hong

[11] Patent Number: 5,966,600
[45] Date of Patent: Oct. 12, 1999

[54] DRAM PROCESS WITH A MULTILAYER STACK STRUCTURE

[75] Inventor: Gary Hong, Hsin-Chu, Taiwan

[73] Assignee: United Semiconductor Corp., Hsin-Chu, Taiwan

[21] Appl. No.: 08/975,496

[22] Filed: Nov. 21, 1997

[51] Int. Cl.$^6$ .............................................. H01L 21/8242
[52] U.S. Cl. ........................................... 438/253; 438/970
[58] Field of Search ................................... 438/253, 256, 438/396, 399, 634, 970

[56] References Cited

U.S. PATENT DOCUMENTS

| | | | |
|---|---|---|---|
| 5,275,972 | 1/1994 | Ogawa et al. | 438/970 |
| 5,362,666 | 11/1994 | Dennison | 438/970 |
| 5,488,011 | 1/1996 | Figura et al. | 438/253 |

*Primary Examiner*—Chandra Chaudhari
*Attorney, Agent, or Firm*—Robin & Champagne, P.C.

[57] ABSTRACT

A DRAM is formed using a process which uses few critical lithography steps and which provides capacitor electrodes and bit line contacts in a self-aligned manner in a common set of processing steps. A multilayer stack including a gate oxide layer, a gate electrode layer, an etch stop layer, and a thicker sacrificial layer are provided over the active device regions of a semiconductor substrate. Photolithography and etching define gate electrodes and wiring lines with patterned etch stop layers and patterned sacrificial layers over and self-aligned with the gate electrodes and wiring lines. Source/drain regions are formed self aligned to the patterned stacks and then an insulating spacer is provided alongside the edges of the gate electrodes. A relatively thin, conformal polysilicon layer is provided over the patterned stacks and in contact with the source/drain regions adjacent the gate electrodes. A planarizing layer is provided to fill in the gaps over the polysilicon layer between the stacks of gate electrodes, patterned etch stop layers and patterned sacrificial layers. A polishing process is performed to remove the conductive layer over the patterned sacrificial layers. The exposed sacrificial layer and the planarizing layers are removed to provide lower capacitor electrodes with vertically extending fins and bit line contacts with landing pads that facilitate making contacts to the bit line contacts. Processing continues to provide a capacitor dielectric layer, an upper capacitor electrode and a bit line contact to complete the DRAM.

23 Claims, 3 Drawing Sheets

DRAM PROCESS WITH A MULTILAYER STACK STRUCTURE

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to transfer charge either to or from the charge storage capacitor. The selective coupling of the charge storage capacitor to the bit line is accomplished using a transfer field effect transistor (FET). A contact between the bit line and the transfer FET is made to one of the source/drain electrodes of the transfer FET and the charge storage capacitor is formed in contact with the other of the source/drain electrodes of the transfer FET. Word line signals are supplied to the gate of the FET to selectively connect the lower electrode of the charge storage capacitor through the transfer FET to the bit line contact facilitating the transfer of charge between the charge storage capacitor and the bit line.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which is undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture.

SUMMARY OF THE PREFERRED EMBODIMENTS

It is accordingly an object of the present invention to provide a more manufacturable DRAM incorporating an increased capacitance charge storage capacitor.

An aspect of the invention provides a method of making an integrated circuit device by providing a gate electrode layer and a sacrificial layer in sequence over a substrate to form a multilayer stack structure over the substrate. The multilayer stack structure is patterned to provide a pattern of gate electrodes covered by a like pattern of sacrificial structures formed from the sacrificial layer and aligned with the pattern of gate electrodes. Source/drain regions are formed along the sides of the gate electrodes. A conductive layer is provided over the pattern of sacrificial structures, with the conductive layer extending over one of the sacrificial structures and a corresponding one of the gate electrodes to make contact with first and second source/drain regions on either side of the one gate electrode, and so that a horizontal portion of the conductive layer extends across an upper surface of the one sacrificial structure. At least part of the horizontal portion of the conductive layer is removed to define a first conductive structure in contact with the first source/drain region and a second conductive structure in contact with the second source/drain region. At least part of the sacrificial structure is removed to expose a vertically extending surface of the first conductive structure previously covered by the removed part of the sacrificial structure. A dielectric layer is formed over exposed surfaces of the first conductive structure. A conductive upper electrode is provided over the dielectric layer and an insulating layer over the conductive upper electrode. A bit line contact is made to the second conductive structure.

Another aspect of the invention forms an integrated circuit device by providing a gate oxide layer, a gate electrode layer, an etch stop layer and a sacrificial layer over an active device region of a substrate to form a multilayer stack structure. An etching mask is formed on the multilayer stack structure and then etching is performed first through the sacrificial layer, through the etch stop layer and then through the gate electrode layer using the etching mask to provide a pattern of gate electrodes covered by a like pattern of sacrificial structures. Source/drain regions are formed along sides of the gate electrodes by ion implantation aligned with the pattern of sacrificial structures. An insulating spacer layer is deposited over the pattern of sacrificial structures and etching back the insulating spacer layer to provide insulating spacer structures adjacent the edges of the gate electrodes. A polysilicon layer is provided over the pattern of sacrificial structures, the polysilicon layer extending over sides of one of the sacrificial structures and adjacent the sides of a corresponding one of the gate electrodes to make contact with first and second source/drain regions on either side of the one gate electrode, a horizontal portion of the polysilicon layer extending across an upper surface of the one sacrificial structures. A planarizing layer is deposited over the polysilicon layer. Part of the polysilicon layer is removed to expose a surface of the one sacrificial structure, leaving a first polysilicon structure in contact with the first source/drain region and a second polysilicon structure in contact with the second source/drain region. The sacrificial structure is etched to expose a first vertically extending surface of the first conductive structure previously covered by the sacrificial structure. The planarizing layer is etched to expose a second vertically extending surface of the first conductive structure previously covered by the planarizing layer. A dielectric layer is formed over the first and second vertically extending surfaces of the first conductive structure. A conductive upper electrode is formed over the dielectric layer and an interlayer insulating layer over the conductive upper electrode. A bit line contact is formed to the second conductive structure.

DETAILED DESCRIPTION OF THE PREFERRED EMBODIMENTS

According to particularly preferred embodiments of the present invention, a DRAM is formed by initially providing a multilayer stack including a gate oxide layer, a gate electrode layer, an etch stop layer, and a thick sacrificial layer over the active device regions of a semiconductor substrate. Photolithography and etching are performed to define gate electrodes and wiring lines with patterned etch stop layers and patterned sacrificial layers self-aligned with the gate electrodes and wiring lines. Source/drain regions are formed self aligned to the patterned stacks. An insulating spacer is provided alongside the edges of the gate electrodes to insulate the sides of the gate electrodes from the bit line contacts and the capacitor electrodes. A conductive layer is provided over the etched stacks in contact with the source/drain regions. This conductive layer will be formed into portions of lower capacitor electrodes over some of the source/drain regions and will become part of the bit line contacts over others of the source/drain regions. A planarizing layer is provided alongside the conductive layers to fill in the gaps between the stacks of gate electrodes, patterned etch stop layers and patterned sacrificial layers. A polishing or etch back process is performed to remove the conductive layer over the patterned sacrificial layers. The exposed surfaces of the patterned sacrificial layers and the planarizing layers are removed to expose the surfaces of the lower capacitor electrodes and the polysilicon landing pads that will become parts of the bit line contacts. Processing continues to provide a capacitor dielectric layer, an upper capacitor electrode and a bit line contact to complete the DRAM cells.

Preferred embodiments of the present invention form lower capacitor electrodes and bit line contacts in a self aligned manner. As will be described in further detail below, the lower capacitor electrodes and the bit line contacts are provided at the same time using common process steps. Avoiding separate processing steps in defining the lower capacitor electrodes and the bit line contact landing pads reduces the processing complexity and the expense of the DRAM formation process. In addition, the described methods form stacked capacitor electrodes with vertically extending fins without critical dimension lithography steps. Particularly preferred embodiments of the present invention are now described with reference to FIGS. 1–6. Many aspects of the manufacture of DRAMs are conventional and well known to those practicing in the art. As such, the following discussion omits certain of the details of the manufacturing process and presents in summary still other aspects of the manufacturing process to better emphasize the distinctive teachings of the present invention.

Figure 1:
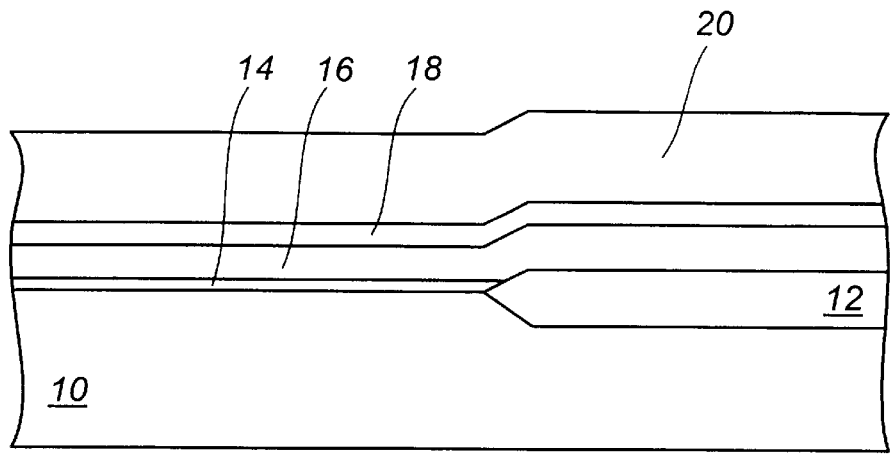
FIGS. 1–6 illustrate steps in forming a DRAM in accordance with preferred embodiments of the present invention.

FIG. 1 shows in schematic cross-section a portion of two cells of a DRAM at an intermediate stage of manufacture in accordance with the present invention. The exemplary DRAM cells are formed on a P-type substrate 10 which has on its surface an array of field oxide device isolation regions 12 that provide isolation between the various memory cells and devices of the DRAM. The device isolation regions might be formed using a modified local oxidation of silicon (LOCOS) method, as schematically illustrated, or might be formed as shallow trench isolation structures. Shallow trench isolation structures might be formed by etching trenches into the substrate, refilling the trenches with oxide in a chemical vapor deposition (CVD) process, and planarizing the surface of the device in a chemical mechanical polishing (CMP) process. Formation of the exemplary DRAM continues by providing a multilayer stack consisting of a gate oxide layer 14 on the active device regions, a layer of conductive material 16 including at least a layer of doped polysilicon over the substrate, followed by an etch stop layer 18 such as silicon nitride and a sacrificial layer 20 such as silicon oxide over the etch stop layer 18. Particular materials are identified here to more effectively illustrate embodiments of the invention, but it should be understood that other individual materials and other combinations of at least some of these materials might well be used instead to implement the general methods of the present invention. The layer of conductive material will be formed into gate electrodes over the gate oxide layer 14 and wiring lines over the field oxide regions 12. Etch stop layer 18 is chosen with reference to the other materials, especially the sacrificial layer 20, used in the overall structure to limit certain processing steps in a manner that provides improved process margins for these steps to facilitate processes in accordance with the present teachings.

The gate oxide layer 14 is grown on the surface of the substrate to a typical thickness of about 30–200 Å by thermal oxidation in an oxygen environment at a temperature of 800–1000° C. Gate oxide layer 14 covers all of the active device regions defined between the field oxide device isolation regions 12. Soon after the gate oxide layer is grown, a layer of polysilicon 16 is deposited by low pressure chemical vapor deposition (LPCVD) over the surface of the device to a thickness of 1000–3000 Å and more preferably to a thickness of approximately 1500–2500 Å. This polysilicon layer will be incorporated into the gate electrodes of the transfer FETs and the wiring lines that extend between the gate electrodes of adjacent cells. The gate electrode polysilicon layer is either doped in situ during deposition or by ion implantation, typically using arsenic or phosphorus, followed by annealing in the conventional fashion. A layer of a metal or metal silicide might then be provided over the surface of the polysilicon layer to reduce the resistivity of the gate electrode and wiring line conductors. The metal layer is preferably tungsten silicide ($WSi_x$) or titanium silicide ($TiSi_x$) having a thickness of about 1500 Å which is preferably deposited directly by chemical vapor deposition or by using sputtering or another physical vapor deposition technique. It should be noted that both more and less complicated gate electrode and wiring line structures might be used.

After the silicide layer is provided on the polysilicon layer, if such a silicide layer is provided, an etch stop layer 18, preferably consisting of silicon nitride, is provided by CVD or comparable method on the conductive layer 16. The silicon nitride etch stop layer 18 will be patterned along with other layers within the stacked structure to provide etch stop layers above each of the conductive layers in the gate electrodes and wiring lines. This etch stop layer is selected to protect the gate electrodes and wiring lines from polysilicon loss during the etching step used to remove the sacrificial layer from above the gate electrodes and wiring lines, as discussed in greater detail below. The composition of the etch stop layer is chosen with reference to the material chosen for the sacrificial layer. Most often, the sacrificial layer is selected to be an oxide because oxides can be deposited at comparatively high deposition rates and can be etched at comparatively high rates. Because oxides are typically preferred for the sacrificial layer, silicon nitride is a preferred etch stop material, since appropriate etching systems are available to selectively etch the oxide using a layer of silicon nitride as a stop for the etching process. The thickness of the nitride etch stop layer is preferably sufficient to allow the silicon nitride to withstand erosion during an oxide etching process in which 2000 Å or more of an oxide planarizing layer is removed after the point in the etching process at which the silicon nitride layer is exposed. It is thus desirable to provide a silicon nitride etch stop layer on the order of 100–1000 Å in thickness, depending on the selectivity of the particular oxide etching processes used.

The multilayer stack illustrated in FIG. 1 also includes a thick sacrificial layer 20. By patterning the multilayer stack, conformally depositing a layer of conductor over the patterned stack, and removing the conductor by, for example, chemical mechanical polishing (CMP), the thickness of the sacrificial layer 20 defines the height and the charge storage capacitance of the lower capacitor electrodes. As such, the particular thickness of the sacrificial layer is selected to provide a necessary level of capacitance to the charge storage capacitors. Typically, it is desirable to provide a high level of charge storage and so it is desirable to make the sacrificial layer 20 thick, for example about 5000 Å and, as necessary, up to approximately 10,000 Å or more. Because it is desirable to provide a thick sacrificial layer and it will be necessary to etch through this thick sacrificial layer, CVD silicon oxide from, for example, a tetra-ethyl-ortho-siloxane (TEOS) source gas is a preferred sacrificial layer. CVD TEOS oxide can be deposited at relatively high speeds and can be etched at high rates using etchants such as those derived in plasma processes from a $CF_4$ source gas.

Figure 2:
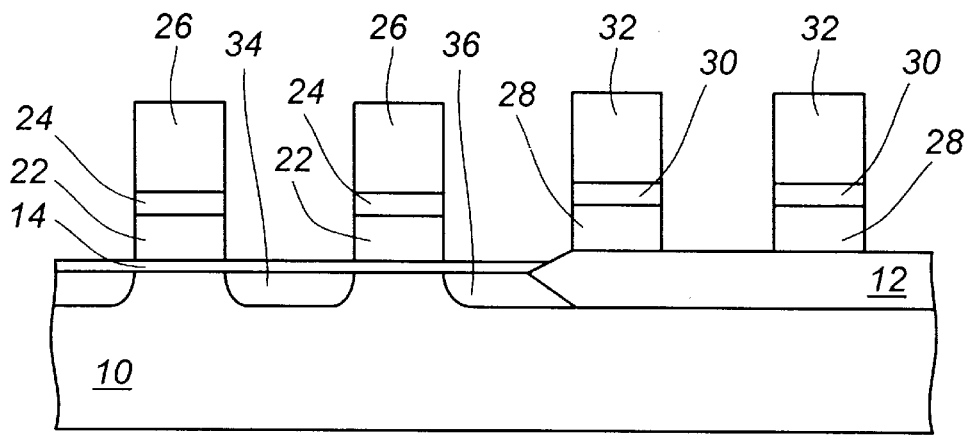
Figure 3:
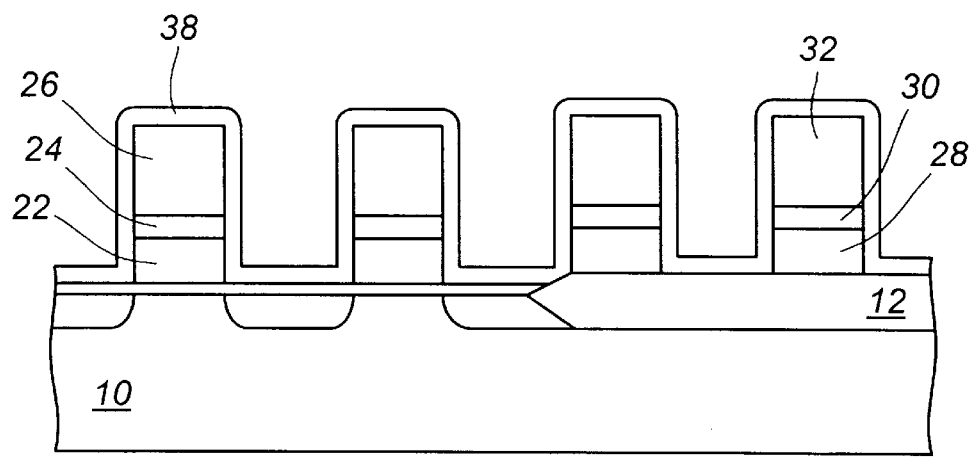

After the multilayer stack of FIG. 1 is formed, a photoresist etch mask (not illustrated) is provided on the surface of the sacrificial layer 20 and etching is performed through the various layers of the multilayer stack. Etching through the preferred oxide sacrificial layer 20 is accomplished using, for example, reactive ion etching (RIE) with a $CF_4$ source gas. Etching through the etch stop layer may be accomplished using RIE with an $SF_6$ source gas. Etching through the polysilicon layer 16 is accomplished by RIE or another plasma etching process using a chlorine etch chemistry or using an etchant derived from HCl and HBr source gases. Although it is possible that the gate oxide layer 14 will be etched through at the end of the polysilicon etching process, additional oxide will generally grow on the surface of the substrate during a subsequent ion implantation and annealing process. After the various layers are etched through, a pattern of gate electrodes 22 covered by like patterned etch stop layers 24 and covered by like patterned sacrificial oxide structures 26 extend over the active device regions of the substrate. Similar multilayer structures of a conductive wiring line layer 28, an etch stop layer 30 and sacrificial structures 32 are formed at the same time as extensions of the multilayer structures incorporating the gate electrodes for the adjacent cells. This structure is illustrated in FIG. 2. Moderately doped source/drain regions 34, 36 are formed by ion implantation self-aligned to the gate electrodes 22 and the sacrificial structures 26, and the device isolation regions 12 in the conventional manner. For example, the source/drain regions might be formed by implanting arsenic or phosphorus ions at an energy of 30–100 KeV to a dosage of between about $1\times10^{13}/cm^2$ to $1\times10^{14}/cm^2$. In most DRAM applications, it is preferred to not utilize an LDD structure for the source/drain regions, particularly for the capacitor contacts, and instead to use a single doping to produce more uniformly doped source/drain regions.

Figure 4:
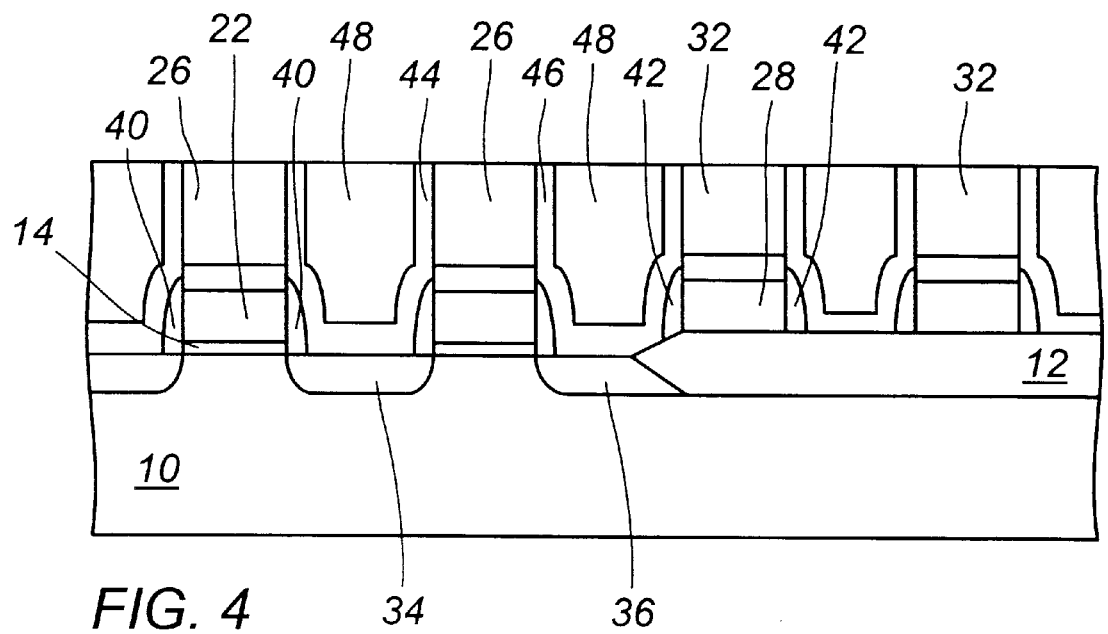
Figure 5:
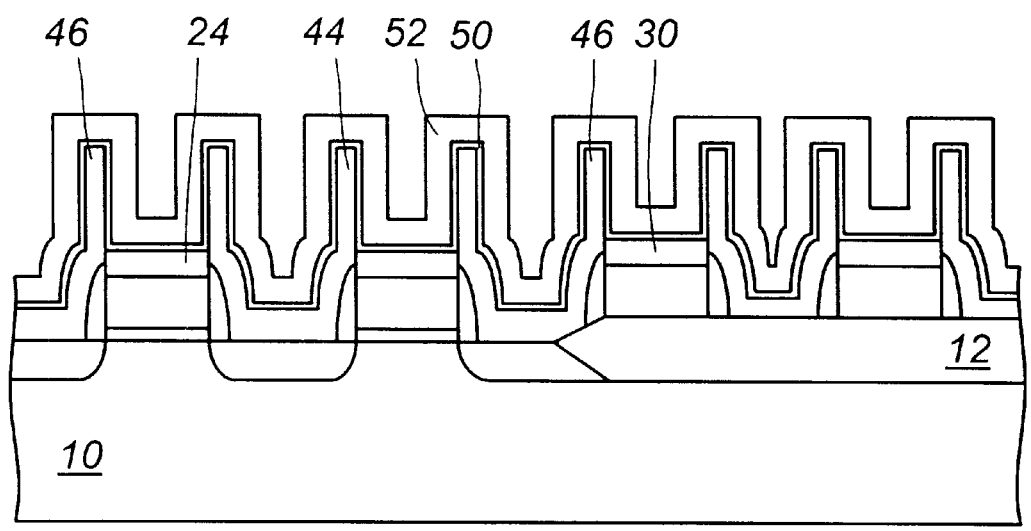
Figure 6:
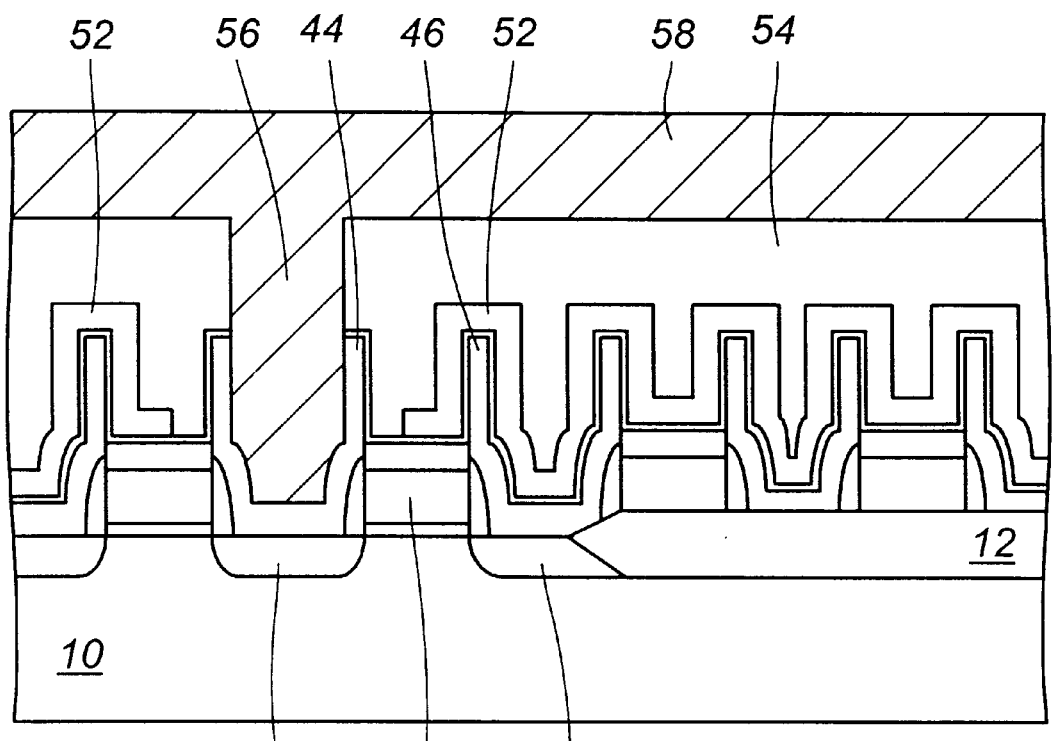

After the gate electrodes 22 and source/drain regions 34, 36 of the transfer FETs are formed, protective spacer structures are formed along the sidewalls of the gate electrodes 22 to insulate the gate electrodes 22 from the lower capacitor electrodes and the bit line contacts to be subsequently formed. Similar spacer structures are formed alongside the wiring lines 28 to isolate those lines from subsequently formed structures. The spacer structures are formed by depositing a layer of silicon nitride 38 over the surface of the FIG. 2 device, for example using CVD to produce the structure shown in FIG. 3. Generally, the thickness of the silicon nitride layer deposited will determine the width by which the spacer structures extend from the gate electrodes. Depending on the particular device dimensions used in forming the DRAM cell, the silicon nitride layer might be deposited to a thickness of between about 100–2000 Å. An anisotropic etch back process is performed without a mask to form the spacer structures 40, 42 on the sidewalls of the gate electrodes 22 and on the sidewalls of the wiring lines 28. The etching process might utilize a reactive ion etching process or another plasma driven process using an etchant derived from a source gas including, for example, $SF_6$. The etching process is continued for a sufficient amount of time so that the upper edges of the spacer structures 40, 42 are below the upper edge of the etch stop layers 24, 30 above the gate electrodes 22 and wiring lines 28, as shown in FIG. 4. If the etching process used to form the sidewall spacer structures 40, 42 does not remove any oxide remaining on the surfaces of the source/drain regions 34, 36, it is preferred that a further oxide etch be performed to clean the surface of the source/drain regions 34, 36 before the conductive layer is deposited over the surface of the structure.

Next, a conductive layer is provided over the multilayer stacked structures and in contact with the source/drain regions. This conductive layer will be formed into at least part of the lower electrodes of the DRAM charge storage capacitors and into landing pads for the bit line contacts of the DRAM array. Generally, the conductive layer is polysilicon having a sufficient thickness to support fins extending vertically above the level of the gate electrodes; for example, the thickness of the polysilicon layer might be on the order of about 500–1500 Å, depending on the particular geometry and design rules of the DRAM. The polysilicon layer is preferably deposited using low pressure chemical vapor deposition (LPCVD) under conventional parameters to produce a polysilicon layer of about constant thickness over all of the exposed surfaces of the device so that the polysilicon layer is substantially conformal with the underlying topology of the partially completed device. The polysilicon layer may be doped in situ during deposition through the addition of either arsine or phosphine gases during the LPCVD process, or the polysilicon layer might be doped by diffusion or by ion implantation followed by an annealing process. It is, of course, possible that the polysilicon layer might not be doped at this point in the process and instead might be doped nearer to the end of the DRAM formation process. Even though the polysilicon layer might not be doped at this stage in the processing, the following discussion nevertheless refers to the polysilicon layer as conductive, since it will have to be rendered conductive at some point in time to be functional.

After the conductive layer is provided over the stacked structures, a planarizing layer is provided over the conductive layer. The planarizing layer facilitates the use of an etching process or, more preferably, a CMP process to pattern and laterally define the portions of the conductive layer that become the capacitor electrodes and bit line contacts according to the present invention The planarizing layer may be, for example, a layer of CVD TEOS oxide deposited to a sufficient thickness to fill in the gaps between the adjacent stacks of electrodes and sacrificial structures and to provide an overfill that extends over the surface of the device. A polishing or other planarization process is performed to initially remove portions of the planarizing layer and then portions of the polysilicon conductive layer and finally a portion of the sacrificial structures exposed after the portions of the polysilicon conductive line is removed. Aspects of the structure at this stage of processing are illustrated in FIG. 4. As shown, gate electrodes 22 and wiring lines 28 have sacrificial structures 26 and 32 extending vertically above and aligned with the underlying electrodes 22 and wiring lines 28, respectively. One conductive polysilicon structure 44 is connected to a corresponding source/drain region 34; this conductive polysilicon structure will become part of the bit line contact for the DRAM configuration. Another polysilicon structure 46 is connected to a corresponding source/drain region 36; this conductive polysilicon structure will, in the preferred embodiments of the invention, become the lower capacitor electrode of the charge storage capacitor. Silicon nitride spacers 40 insulate the gate electrodes 22 from the polysilicon structures 44, 46 and silicon nitride spacers 42 insulate the wiring lines 28 from the polysilicon conductive structures. Remaining portions of the planarizing layer 48 fill the gaps lined by the polysilicon structures 44, 46. The preferred polishing process defines a planar surface over the sacrificial structures 26, 32, the upper surfaces of the fins of polysilicon structures 44, 46 and the planarizing layer 48. Vertically extending portions of the polysilicon structures 44, 46 separate the sacrificial structures 26, 32 from the remaining portions of the planarizing layers 48.

The exposed surfaces of the preferred oxide sacrificial structures 26, 32 and the remaining portions of the planarizing layer 48 are next subjected to an etching process to remove the sacrificial structures and planarizing layer from around the polysilicon structures 44, 46. These structures might be removed in a wet etching process using a dilute hydrofluoric acid solution. More preferably, however, the oxide sacrificial structures and oxide planarizing layer are removed in a dry etching process because such processes are more compatible with the rest of the DRAM process technology. The preferred etching process might utilize a plasma etching process using an etchant derived in a plasma process from $CF_4$. This etching process is facilitated by providing the preferred silicon nitride etch stop layer 24 to protect the gate electrode 22. When the sacrificial structures 26, 32 are removed in the same etching process as is used to remove the planarizing layer 48, the sacrificial structures will be completely removed before the planarizing layer is completely removed. Typically, it will be necessary to etch approximately 2000 Å or more of the remaining portion of the planarizing layer 48 after the sacrificial structures are removed. As such, it is desirable for the silicon nitride etch stop layers 24, 30 to be sufficiently thick to partially remain after the planarizing layer is completely removed, protecting the gate electrodes 22 and wiring lines 28 from polysilicon loss. Depending on the particular pattern of the polysilicon bit line contacts 44 and the polysilicon capacitor electrodes 46, it may be necessary to perform an etching process to define separate bit line contacts and lower capacitor electrodes at this time. This etching process, when necessary, is accomplished in the conventional manner.

Next, a layer of capacitor dielectric material 50 (FIG. 5) is provided over all of the exposed surfaces of the lower charge storage capacitor electrode 46. A capacitor dielectric material might be provided by depositing a thin layer of(~30–50 Å) of CVD silicon nitride and growing a thin layer of oxide (~5–15 Å) on the nitride layer to form the dielectric material known as "NO." In alternate embodiments of the present invention, a higher dielectric constant capacitor dielectric material is chosen. In an alternate embodiment, a layer of tantalum pentoxide, nominally $Ta_2O_5$, is deposited in a chemical vapor deposition (CVD) process from a source gas mixture consisting of $Ta(OC_2H_5)_5 + O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 50 does not have unacceptable pin holes or an unacceptable breakdown voltage. Because the preferred capacitor dielectric layer is deposited at least in part by CVD, the capacitor dielectric layer 50 will typically extend over the surfaces of the device that are exposed during this dielectric formation process.

An upper capacitor electrode is next formed over the DRAM structure in accordance with preferred embodiments of the present invention. For most embodiments, the upper capacitor electrode 52 includes a layer of doped polysilicon deposited to a thickness of 1500–2500 Å. When a tantalum pentoxide capacitor dielectric is used, it is preferred that titanium nitride (TiN) be used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode 46. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a metal organic chemical vapor deposition (MOCVD) process. Titanium nitride can be deposited by MOCVD from $TiCl_4 + NH_3$ source gases at a comparatively low substrate temperature. The MOCVD process has the further advantage over sputtering that MOCVD is much less likely to heat the deposition substrate during the deposition process.

The upper capacitor electrode 52 is then patterned to remove the upper capacitor electrode 52 from above polysilicon structure 44 that forms part of the bit line contact. This is accomplished using a photoresist etching mask and a conventional etching process. Processing continues to cover the upper capacitor electrode 52 with an interlayer insulating layer 54, for example by depositing boron phosphorus silicate glass (BPSG) in a CVD process. A bit line contact opening is then formed through the interlayer insulating layer 54 to expose the surface of bit line contact pad 44. Next, the contact opening is filled with a metal interconnect 56 and a metal bit line 58 is provided. Further conventional processing is performed to complete the formation of the DRAM cell and support circuitry.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of making an integrated circuit device comprising the steps of:

providing a gate electrode layer and a sacrificial layer in sequence over a substrate to form a multilayer stack structure over the substrate;

patterning the multilayer stack structure to provide a pattern of gate electrodes covered by a like pattern of sacrificial structures formed from the sacrificial layer and aligned with the pattern of gate electrodes;

forming source/drain regions along sides of the gate electrodes;

providing a conductive layer over the pattern of sacrificial structures, the conductive layer extending over one of the sacrificial structures and a corresponding one of the gate electrodes to make contact with first and second source/drain regions on either side of the one gate electrode, a horizontal portion of the conductive layer extending across an upper surface of the one sacrificial structure;

removing at least part of the horizontal portion of the conductive layer to define a first conductive structure in contact with the first source/drain region and a second conductive structure in contact with the second source/drain region;

removing at least part of the one sacrificial structure to expose a vertically extending surface of the first conductive structure previously covered by the removed part of the one sacrificial structure;

forming a dielectric layer over exposed surfaces of the first conductive structure;

forming a conductive upper electrode over the dielectric layer;

providing an interlayer insulating layer over the conductive upper electrode, and forming a bit line contact to the second conductive structure.

2. The method of claim 1, further comprising the steps of providing insulating spacers alongside the gate electrodes between the gate electrodes and the conductive layer.

3. The method of claim 1, wherein the insulating spacers are formed by a process comprising the steps of:

depositing an insulating layer over the sacrificial structures and extending along the sides of the gate electrodes; and etching back the insulating layer to provide the insulating spacers.

4. The method of claim 3, wherein the insulating layer comprises silicon nitride.

5. The method of claim 4, wherein the step of etching back uses the one sacrificial layer as an etch stop.

6. The method of claim 3, further comprising the step of removing oxide from surfaces of the source/drain regions to expose the substrate after the step of depositing the insulating layer and before the step of providing the conductive layer.

7. The method of claim 6, wherein the conductive layer comprises polysilicon.

8. The method of claim 1, wherein the conductive layer comprises doped polysilicon.

9. The method of claim 8, wherein the conductive layer is provided by low pressure chemical vapor deposition.

10. The method of claim 1, further comprising the step of depositing a planarizing layer over the conductive layer, wherein the step of removing at least part of the horizontal portion of the conductive layer is performed subsequent to the step of depositing the planarizing layer.

11. The method of claim 10, wherein the step of removing the at least part of the horizontal portion of the conductive layer comprises a polishing process.

12. The method of claim 10, wherein the sacrificial layer and the planarizing layer are both oxides.

13. The method of claim 10, wherein the step of removing at least part of the one sacrificial structure exposes both the one sacrificial structure and the planarizing layer to a common etching environment and wherein a first thickness of planarizing layer is removed which is greater than a second thickness of the sacrificial layer that is removed.

14. The method of claim 13, wherein the sacrificial layer and the planarizing layer are both oxides.

15. The method of claim 14, wherein an etch stop layer is provided between the one sacrificial structure and the one gate electrode, the etch stop layer having a thickness and being of a composition to allow the etch stop layer to remain in part over the one gate electrode after the planarizing layer is removed.

16. The method of claim 15, wherein the planarizing layer is completely removed from above the first conductive structure.

17. The method of claim 16, wherein the step of removing at least part of the sacrificial structure is a dry etching process using a fluorine etch chemistry.

18. The method of claim 15, wherein the etch stop layer comprises silicon nitride.

19. A method of making an integrated circuit device comprising the steps of:

providing a gate oxide layer, a gate electrode layer, an etch stop layer and a sacrificial layer over an active device region of a substrate to form a multilayer stack structure;

forming an etching mask on the multilayer stack structure and then etching first through the sacrificial layer, through the etch stop layer and then through the gate electrode layer using the etching mask to provide a pattern of gate electrodes covered by a like pattern of sacrificial structures;

forming source/drain regions along sides of the gate electrodes by ion implantation aligned with the pattern of sacrificial structures;

depositing an insulating spacer layer over the pattern of sacrificial structures and etching back the insulating spacer layer to provide insulating spacer structures adjacent the edges of the gate electrodes;

providing a polysilicon layer over the pattern of sacrificial structures, the polysilicon layer extending over sides of one of the sacrificial structures and adjacent the sides of a corresponding one of the gate electrodes to make contact with first and second source/drain regions on either side of the one gate electrode, a horizontal portion of the polysilicon layer extending across an upper surface of the sacrificial structure;

depositing a planarizing layer over the polysilicon layer;

removing part of the polysilicon layer to expose a surface of the sacrificial structure, leaving a first polysilicon structure in contact with the first source/drain region and a second polysilicon structure in contact with the second source/drain region;

etching the sacrificial structure to expose a first vertically extending surface of the first conductive structure previously covered by the sacrificial structure;

etching the planarizing layer to expose a second vertically extending surface of the first conductive structure previously covered by the planarizing layer;

forming a dielectric layer over the first and second vertically extending surfaces of the first conductive structure;

forming a conductive upper electrode over the dielectric layer;

providing an interlayer insulating layer over the conductive upper electrode; and forming a bit line contact to the second conductive structure.

20. The method of claim 19, wherein the step of etching the sacrificial structure and the step of etching the planarizing layer are performed concurrently and wherein the sacrificial structure is etched through while etching continues through the planarizing layer.

21. The method of claim 20, wherein the step of etching the sacrificial structure stops on the etch stop layer.

22. The method of claim 20, wherein the etch stop layer has a thickness and a composition to allow the etch stop layer to remain in part over the gate electrode after the planarizing layer is completely etched through.

23. The method of claim 22, wherein the etch stop layer is silicon nitride.

* * * * *